(12) United States Patent
Siriani et al.

(10) Patent No.: US 11,539,189 B2
(45) Date of Patent: Dec. 27, 2022

(54) QUANTUM DOT SLAB-COUPLED OPTICAL WAVEGUIDE EMITTERS

(71) Applicant: Cisco Technology, Inc., San Jose, CA (US)

(72) Inventors: Dominic F. Siriani, Allentown, PA (US); Jock T. Bovington, La Mesa, CA (US); Matthew J. Traverso, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 1025 days.

(21) Appl. No.: 16/242,984

(22) Filed: Jan. 8, 2019

(65) Prior Publication Data

US 2020/0220329 A1    Jul. 9, 2020

(51) Int. Cl.
*H01S 5/22* (2006.01)
*H01S 5/02* (2006.01)
*H01S 5/028* (2006.01)

(52) U.S. Cl.
CPC ............ *H01S 5/2206* (2013.01); *H01S 5/021* (2013.01); *H01S 5/028* (2013.01)

(58) Field of Classification Search
CPC .... H01S 5/0203; H01S 5/0085; H01S 5/3412; H01S 5/02375; H01S 5/3213
USPC ...................................................... 359/344
See application file for complete search history.

(56) References Cited

U.S. PATENT DOCUMENTS

| 8,106,379 | B2 * | 1/2012 | Bowers ............... H01L 31/0304 257/14 |
| 9,274,275 | B2 | 3/2016 | Webster et al. |
| 2012/0300796 | A1 * | 11/2012 | Sysak .................... B82Y 20/00 372/6 |
| 2013/0107901 | A1 | 5/2013 | Deppe |
| 2014/0010253 | A1 * | 1/2014 | Sysak ................ H01S 5/06256 438/31 |
| 2016/0322787 | A1 | 11/2016 | Takabayashi et al. |
| 2017/0207600 | A1 | 7/2017 | Klamkin et al. |

FOREIGN PATENT DOCUMENTS

| WO | 2016070186 A1 | 5/2016 |
| WO | 2019169318 A1 | 9/2019 |

OTHER PUBLICATIONS

PCT Notification of Transmittal of the Internaltional Search Report and the Written Opinion of the International Searching Authority, or the Declaration for Application PCT/US2020/012408, dated May 8, 2020.

(Continued)

*Primary Examiner* — Tuan N Nguyen
(74) *Attorney, Agent, or Firm* — Patterson + Sheridan, LLP

(57) ABSTRACT

An optical apparatus comprises a semiconductor substrate and a slab-coupled optical waveguide (SCOW) emitter disposed on the semiconductor substrate. The SCOW emitter comprises an optical waveguide comprising: a first region doped with a first conductivity type; a second region doped with a different, second conductivity type; and an optically active region disposed between the first region and the second region. The optically active region comprises a plurality of quantum dots.

17 Claims, 9 Drawing Sheets

(56) References Cited

OTHER PUBLICATIONS

Donnelly et al., "High-power slab-coupled optical waveguide lasers and amplifiers," in Advances in Semiconductor Lasers (Semiconductors and Semimetals vol. 86), Coleman, Bryce, & Jagadish, eds., Academic Press, 2012. [Abstract Only].
EFT Manifesto, "Etched Facet Technology: Lighting the Path to 400G and Beyond in the Cloud Data Center," Global Cloud Index (GCI). Cisco. Accessed Apr. 25, 2016., 6 pages.
SET (Smart Equipment Technology) Flip-Chip Bonder Line FC150 http://www.set-sas.fr/en/pp422408-421389-FC150.html.
U.S. Appl. No. 15/660,916 titled "Template-Based Epitaxial Growth of Lattice Mismatched Materials on Silicon,", filed Jul. 26, 2017.
U.S. Appl. No. 15/910,852 titled, "Substrate Technology for Quantum Dot Lasers Integrated on Silicon,", filed Mar. 2, 2018.
U.S. Appl. No. 15/910,684 titled, "Silicon Photonics Co-Integrated With Quantum Dot Lasers on Silicon,", filed Mar. 2, 2018.
U.S. Appl. No. 15/910,435 titled, "Quantum Dot Lasers Integrated on Silicon Submount With Mechanical Features and Through-Silicon vias,", filed Mar. 2, 2018.
Chen et al., "Electrically pumped continuous-wave 1.3 ?m InAs/GaAs quantum dot lasers monolithically grown on on-axis Si (001) substrates," Optics Express, vol. 25, No. 5, Mar. 6, 2017, 8 pages.
Juodawlkis et al.,"High-Power, Low-Noise 1.5-?m Slab-Coupled Optical Waveguide (SCOW) Emitters: Physics, Devices, and Applications," IEEE Journal of Selected Topics in Quantum Electronics, vol. 17, No. 6, Nov./Dec. 2011, 17 pages.
Liu et al., "Electrically pumped continuous-wave 1.3 ?m quantum-dot lasers epitaxially grown on on-axis (001) GaP/Si," Optic Letters, vol. 42, No. 2, Jan. 15, 2017, 4 pages.
Shinji Matsuo, "High-performance Lasers on InP-SOI Platform," OFC, 2017, 3 pages.
Moerman et al., "A Review on Fabrication Technologies for the Monolithic Integration of Tapers with III-V Semiconductor Devices," IEEE Journal of Selected Topics in Quantum Electronics, vol. 3, No. 6, Dec. 1997, 13 pages.
Norman et al., "Electrically pumped continuous wave quantum dot lasers epitaxially grown on patterned, on-axis (001) Si," Optics Express, vol. 25, No. 4, Feb. 20, 2017, 8 pages.
Plant et al., "1.5-pm InGaAsP-InP Slab-Coupled Optical Waveguide Lasers," IEEE Photonics Technology Letters, vol. 17, No. 4, Apr. 2005, 3 pages.

\* cited by examiner

QUANTUM DOT SLAB-COUPLED OPTICAL WAVEGUIDE EMITTERS

TECHNICAL FIELD

Embodiments presented in this disclosure generally relate to integrating a slab-coupled optical waveguide (SCOW) emitter with a semiconductor photonic chip.

BACKGROUND

Coherent modulation formats are of primary interest for long-haul and metro applications, and are gaining increased attention for shorter-reach and data center interconnect (DCI) applications. However, coherent modulators in silicon are inherently high-loss due to modulating both phase and amplitude. For upcoming 600 GB, 800 GB, and 1 TB applications, the transmitter insertion loss of the coherent modulators is estimated at 25-29 dB. Meanwhile, the required transmitter output power into the optical fiber is between 0 and +3 dBm.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
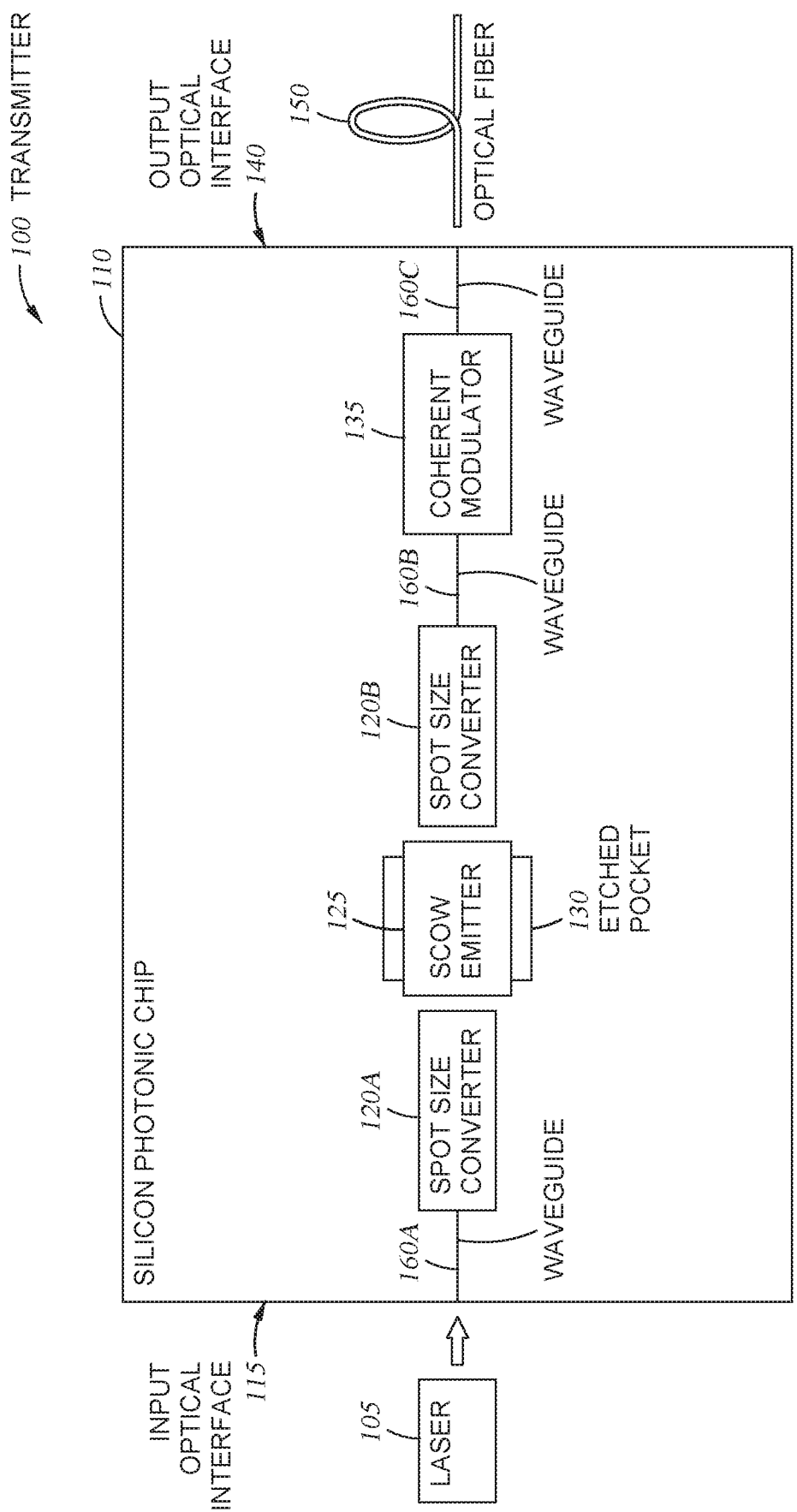
FIG. 1 is a top view of a transmitter with a SCOW emitter mounted on a silicon photonic chip, according to one or more embodiments.

One embodiment presented in this disclosure is an optical apparatus comprising a semiconductor substrate and a slab-coupled optical waveguide (SCOW) emitter disposed on the semiconductor substrate. The SCOW emitter comprises an optical waveguide comprising a first region doped with a first conductivity type; a second region doped with a different, second conductivity type; and an optically active region disposed between the first region and the second region, the optically active region comprising a plurality of quantum dots.

Another embodiment presented in this disclosure is a method of fabricating a slab-coupled optical waveguide (SCOW) emitter. The method comprises forming a first cladding layer over a semiconductor substrate, and forming a first optical waveguide over the first cladding layer. The first optical waveguide is doped with a first conductivity type. The method further comprises forming a plurality of quantum dots in an optically active region disposed above the first optical waveguide, and forming a second optical waveguide over the optically active region. The second optical waveguide is doped with a different, second conductivity type. The method further comprises forming a second cladding layer over the second optical waveguide.

Another embodiment presented in this disclosure is an optical system comprising a photonic chip comprising an optical component having a first height relative to a first surface. The optical system further comprises a semiconductor substrate having a second surface, and a slab-coupled optical waveguide (SCOW) emitter contacting the second surface. The SCOW emitter comprises an optical waveguide having a second height relative to the second surface. The optical waveguide comprises a first region doped with a first conductivity type, a second region doped with a different, second conductivity type, and an optically active region disposed between the first region and the second region. The optically active region comprises a plurality of quantum dots. When the first surface contacts the second surface, the optical waveguide is optically aligned with the optical component in at least one dimension.

Example Embodiments

To meet the required transmitter output power mentioned above, an Integrated Tunable Laser Assembly (ITLA) would need to achieve +25 to 30 dBm output, or up to 1 Watt. Such a laser is prohibitive from both a cost and power consumption point of view. Currently, tunable lasers are only available with +18 dBm output power.

An inline amplifier (e.g., micro erbium-doped fiber amplifier (EDFA)) can be used to relax the required input power from the laser. However, adding the inline amplifier introduces excess noise into the modulated signal, which can significantly reduce transmission distance. As modulation format complexity increases, higher output optical signal-to-noise ratio (OSNR) is desired. For 1 TB optical links, greater than 45 dB OSNR is desired. Thus, no more than 3-4 dB of gain is achievable due to noise introduced by the inline amplifier.

Several additional challenges are encountered with integrating laser sources and other optically active components with a semiconductor-based photonic chip. For example, an efficient coupling of light between the laser source and the photonic chip can require a complex and costly optical alignment process. To support higher data rates (e.g., through faster modulation and/or more optical channels), the laser source may be scaled to higher power levels. In some cases, additional optical components such as lenses and isolators may be needed to protect against optical feedback. In some cases, it may be necessary to attach a laser source to a submount before integrating with the photonic chip, which increases fabrication costs and reduces overall fabrication yields.

According to embodiments discussed herein, an optical apparatus comprises a semiconductor substrate and a slab-coupled optical waveguide (SCOW) emitter disposed on the semiconductor substrate. In some embodiments, the semiconductor substrate comprises a silicon substrate, although other types of semiconductor materials are also contemplated. The SCOW emitter comprises an optical waveguide comprising a first region doped with a first conductivity type, a second region doped with a different, second conductivity type, and an optically active region disposed between the first region and the second region. The optically active region comprises a plurality of quantum dots.

Beneficially, the optical apparatus may be more readily integrated with a semiconductor-based photonic chip. The SCOW emitter provides improved coupling efficiency due to a large mode size. Further, the SCOW emitter is scalable to higher optical powers due to the large mode size, low intrinsic losses, and a low optical confinement factor.

The SCOW emitter may be integrated directly with a semiconductor substrate, eliminating a requirement for a separate submount. The semiconductor substrate offers additional features, such as through-silicon vias (TSVs), precise mechanical features using, e.g., photolithography and wet etching, a high thermal conductivity, a matched coefficient of thermal expansion (CTE) with the photonic chip. Also enables wafer-scale processing, test, and burn-in.

Further, using quantum dots as the optically active gain medium offers reliable integration onto silicon, improving material defect robustness. Also accommodates high-temperature operation with very little performance degradation. Further, high tolerance against parasitic optical back-reflection into the laser.

FIG. 1 is a top view of a transmitter 100 with a SCOW emitter 125 mounted on a silicon photonic chip 110, according to one embodiment described herein. The transmitter 100 includes a laser 105 aligned to an input optical interface 115 of the silicon photonic chip 110. In one embodiment, the laser 105 is an integrable tunable laser assembly (ITLA) that outputs a continuous wave (CW) optical signal, but other types of optical sources are also contemplated. That is, the laser 105 outputs an unmodulated optical signal. However, in some cases the output power of the laser 105 is insufficient for performing coherent modulation.

A first waveguide 160A (e.g., a sub-micron waveguide) in the silicon photonic chip 110 routes the CW optical signal to a spot size converter 120A. Because the mode of the CW optical signal in the first waveguide 160A may be much smaller than the mode size of the waveguide in the SCOW emitter 125, as the CW optical signal propagates through the spot size converter 120A, the spot size converter 120A increases the size of the optical mode to better match the mode of the waveguide formed by the SCOW emitter 125.

As such, the optical coupling efficiency between the silicon photonic chip 110 and the SCOW emitter 125 is improved.

In FIG. 1, the silicon photonic chip 110 defines an etched pocket 130 in which at least a portion of the SCOW emitter 125 is disposed. That is, FIG. 1 provides a top view of the silicon photonic chip 110 where the etched pocket 130 is etched in a direction into the page. The etched pocket 130, which may alternately be a pocket or recess that is formed in any suitable manner, provides a space where the waveguide portion of the SCOW emitter 125 can be disposed to align with the first spot size converter 120A at an input interface and with a second spot size converter 120B at an output interface of the SCOW emitter 125. The second spot size converter 120B receives the optical signal from the SCOW emitter 125 and reduces the mode size so the optical signal better matches the mode size of a second waveguide 160B that is optically coupled with the second spot size converter 120B. Although the spot size converters 120A, 120B are shown as being physically coupled to the first and second waveguides 160A, 160B respectively, one or both of the spot size converters 120A, 120B may be evanescently coupled to the first and second waveguides 160A, 160B.

The amplified CW optical signal generated by the SCOW emitter 125 is provided via the second waveguide 160B to a coherent modulator 135 that performs coherent modulation. The coherent modulator 135 modulates the data and outputs a high-bandwidth signal capable of supporting 600 G, 800 G, and 1 TB applications, and so forth. Although the embodiments herein describe using a SCOW emitter 125 to amplify a CW optical signal for performing coherent modulation, the embodiments are not limited to such. For example, the SCOW emitter 125 can be used to amplify CW optical signals before those signals are transmitted to other types of modulation formats that transmit data at lower speeds. Doing so may permit the use of lower-power lasers 105 which can reduce fabrication costs.

Although the embodiments herein describe using the SCOW emitter 125 in a transmitter 100, the spot size converters 120A, 120B and the SCOW emitter 125 may be used in other silicon photonic applications such as a laser, a pre-amplifier, a booster amplifier, or an amplifier inside of a lossy photonic integrated circuit (PIC) such as a high port count switch. In these examples, the output of the SCOW emitter 125 may be coupled to a different optical component than the coherent modulator 135.

The modulated optical signals generated by the coherent modulator 135 are output onto a third waveguide 160C that is optically coupled with an optical fiber 150 at an output optical interface 140 of the silicon photonic chip 110. Although not shown, the silicon photonic chip 110 may also include spot size converters (e.g., similar to the spot size converters 120A, 120B) at the input optical interface 115 and/or the output optical interface 140 since the mode size of the optical signal generated by the laser 105 and the mode size of the waveguide of the optical fiber 150 may be significantly different from the mode size of the waveguides 160A, 160B, 160C in the photonic chip 110. In another embodiment, the transmitter 100 may include lenses at the input optical interface 115 and/or the output optical interface 140 to compensate for the different mode sizes.

Figure 2:
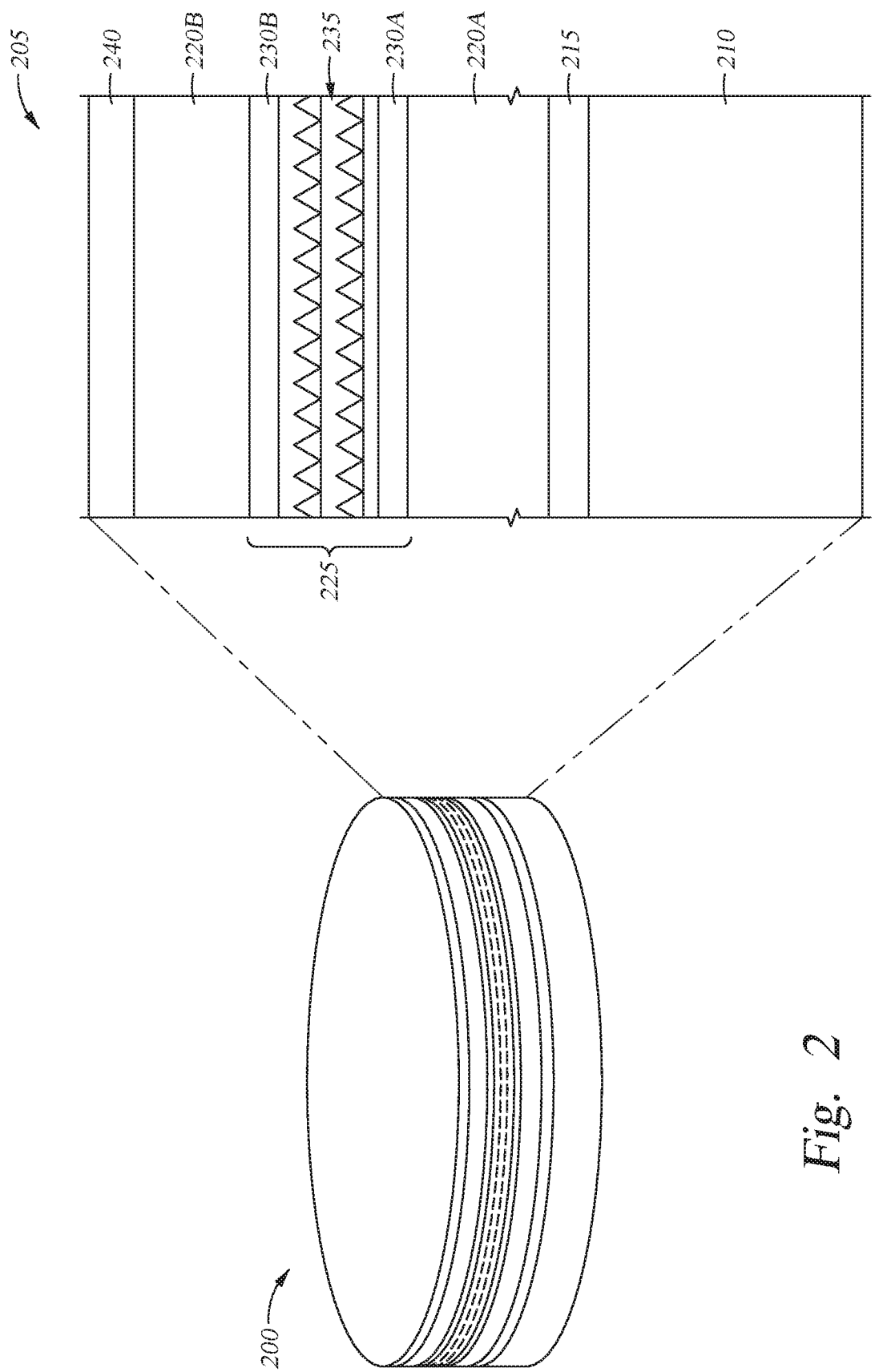
FIG. 2 is a wafer-level view of an exemplary assembly with a quantum dot layer, according to one or more embodiments.

FIG. 2 is a wafer-level view of an exemplary assembly 200 with a quantum dot layer 235, according to one or more embodiments. The assembly 200 may be used in conjunction with other embodiments, such as used to fabricate the SCOW emitter 125 of FIG. 1. As shown in cross-sectional detail 205, the assembly 200 comprises a semiconductor wafer 210, a base layer 215 disposed over the semiconductor wafer 210, a first cladding layer 220A disposed over the base layer 215, a waveguide layer 225 disposed over the first cladding layer 220A, a second cladding layer 220B disposed over the waveguide layer 225, and a contact layer 240 disposed over the second cladding layer 220B. The waveguide layer 225 comprises a first waveguide stratum 230A disposed over the first cladding layer 220A, a quantum dot layer 235 disposed over the first waveguide stratum 230A, and a second waveguide stratum 230B disposed over the quantum dot layer 235. The semiconductor wafer 210 and various layers are not drawn to scale in the cross-sectional detail. Instead, the person of ordinary skill will understand that the absolute and/or relative dimensioning of the semiconductor wafer 210 and various layers may be selected to meet the needs of individual applications.

The semiconductor wafer 210 comprises a semiconductor substrate from which various optical and electrical components may be grown, patterned, etched, deposited, or eutectically bonded. In some embodiments, the semiconductor wafer 210 comprises a bulk silicon (Si) substrate in which one or more features or materials for the active optical device to be produced (e.g., a laser, detector, modulator, absorber) are pre-processed. In various embodiments, the diameter of the semiconductor wafer 210 may range between about 50 millimeters (mm) and about 200 mm, and the thickness may range between about 0.3 mm and about 1 mm. However, the dimensions of the semiconductor wafer 210 may be changed to account for new diameters and thicknesses desired in Si (or other semiconductor material) fabrication industries.

In some embodiments, the base layer 215 comprises a thin film of a III-V semiconductor material that is bonded with the semiconductor wafer 210. The base layer 215 comprises a predetermined thickness of the selected III-V semiconductor material, for example, between about 10 nanometers (nm) and about 1000 nm thick.

In some embodiments, the base layer 215 is formed by bonding a sheet of the III-V semiconductor material to the semiconductor wafer 210, whether directly or indirectly (i.e., via one or more intermediate layers). In some embodiments, a diameter of the sheet is based on the diameter of the semiconductor wafer 210 (e.g., within +/−5% of the wafer diameter), and a thickness of the sheet may vary independently of the thickness of the semiconductor wafer 210 (i.e., thicker, thinner, or the same thickness as the semiconductor wafer 210). In other embodiments, the diameter of the sheet is independent from the diameter of the semiconductor wafer 210. For example, several small sheets may be bonded with the semiconductor wafer 210 having a much larger diameter (e.g., several 50 mm sheets bonded with a 300 mm semiconductor wafer 210). Various methods of bonding the sheet(s) with the semiconductor wafer 210 may be used, which will be familiar to those of ordinary skill in the art. The method of bonding the sheet(s) may differ based on the particular III-V semiconductor material of the sheet(s), and whether any intermediate layers are used. Some non-limiting examples of the III-V semiconductor material of the sheet include a material selected from the boron group (i.e., a group III material: boron, aluminum, gallium, indium, thallium) and a material selected from the nitrogen group (i.e., a group V material: nitrogen, phosphorus, arsenic, antimony, bismuth), such as, for example: boron nitride (BN), gallium nitride (GaN), gallium arsenide (GaAs), and indium phosphide (InP).

In some embodiments, an intermediate layer (not shown) may be sized with a diameter that substantially matches (e.g., +/−1%) the diameter of the semiconductor wafer 210. In some embodiments, the thickness of the intermediate layer is in a range between about 1 nm and about 1000 nm. Some non-limiting examples of materials used in the intermediate layer include dielectrics such as silicon oxide (e.g., $SiO_2$), a polymer, a metal, and a semiconductor. Those of ordinary skill in the art will be familiar with suitable materials that may be used as an intermediate layer.

Further, any of the III-V semiconductor material of the base layer 215, the material of the intermediate layer, and the material of the semiconductor wafer 210 may be doped with various other materials to provide desired physical and/or electrical properties. For example, dopants such as silicon, carbon, zinc, germanium, tin, cadmium, sulfur, selenium, tellurium, beryllium, and/or magnesium may be used to dope the III-V semiconductor material of the base layer 215 for use as an electron emitter or electron collector when used in a semiconductor component. Further, the sheet may be doped prior to, or after, bonding with the semiconductor wafer 210. In another non-limiting example, boron and/or phosphorous may be used as dopants in the semiconductor wafer 210.

In some embodiments, excess material is removed from the sheet after bonding to the semiconductor wafer 210, which provides a desired thickness to the base layer 215. For example, the excess material may be removed from the semiconductor wafer 210 using chemical means, mechanical means, or a combination thereof.

In some embodiments, the first cladding layer 220A and the second cladding layer 220B (which may also be referred to as matrix layers), comprises a lattice-matched material to the III-V semiconductor material of the base layer 215. For example, aluminum gallium arsenide (AlGaAs) may be used for the first cladding layer 220A when GaAs is used for the base layer 215. Other non-limiting examples of lattice-matched materials include indium gallium phosphide (InGaP) with GaAs, and aluminum gallium indium arsenide (AlGaInAs), aluminum indium arsenide (AlInAs), indium gallium arsenide (InGaAs), gallium arsenide antimony (GaAsSb), and indium gallium arsenide phosphide (InGaAsP) with InP. One of ordinary skill in the art will be able to select a lattice-matched material for use with the selected III-V semiconductor material of the base layer 215.

In some embodiments, the first cladding layer 220A and the second cladding layer 220B are epitaxially grown around the waveguide layer 225 and the quantum dot layer 235. In other embodiments, the first cladding layer 220A and the second cladding layer 220B are separately formed, e.g., the first cladding layer 220A is grown from the base layer 215 and the second cladding layer 220B is grown from the second waveguide stratum 230B.

The first waveguide stratum 230A and the second waveguide stratum 230B of the waveguide layer 225 comprise a III-V semiconductor material that is grown to surround the quantum dot layer 235, and which provides a structured gain medium in which the light produced in the quantum dot layer 235 is amplified and is directed outward from the quantum dot layer 235 in one or more directions. In several embodiments, the III-V semiconductor material that comprises the first waveguide stratum 230A and the second waveguide stratum 230B is the same as the III-V semiconductor material of the base layer 215, but may also be made of different III-V semiconductor materials (e.g., AlGaAs when GaAs used for the base layer 215) and/or may be doped differently than the base layer 215. In some embodiments, the first waveguide stratum 230A and the second waveguide stratum 230B are epitaxially grown around the quantum dot layer 235. In other embodiments, the first waveguide stratum 230A is grown from the first cladding layer 220A, and the second waveguide stratum 230B is grown from the quantum dot layer 235.

The quantum dot layer 235 includes a plurality of quantum dots that emit photons when stimulated by an applied electrical current. Quantum dots are nano-structures that exhibit various properties, such as light generation, based on quantum mechanical effects. The quantum dots of the quantum dot layer 235 are surrounded by the first waveguide stratum 230A and the second waveguide stratum 230B of the waveguide layer 225, and are made of materials that have narrower bandgaps than the material of the waveguide layer 225. Quantum dots act as zero-dimensional entities that are embedded in the waveguide layer 225, which enables three-dimensional capture of excited electrons (i.e., preventing movement of the electrons). In contrast, quantum wells are two-dimensional structures formed by a thin layer of a first material surrounded by a wider-bandgap material and that only allow electronic capture in one dimension (allowing planar two-dimensional movement of the electrons). As will be appreciated by one of ordinary skill in the art, the material composition and dimensioning of the quantum dots will affect the properties of the generated light.

The contact layer 240 is made from a III-V semiconductor material. In some embodiments, the contact layer 240 is formed of the same III-V semiconductor material as the base layer 215, and is doped differently than the base layer 215 to form an opposing semiconductor material. For example, when the base layer 215 is p-doped, the contact layer 240 is n-doped, and vice versa. The contact layer 240 forms the most distal layer from the semiconductor wafer 210, and along with the base layer 215 surrounds the quantum dot layer 235, the waveguide layer 225, the first cladding layer 220A, and the second cladding layer 220B. When a sufficient voltage is applied across the contact layer 240 and the base layer 215, an electrical current will flow through the quantum dot layer 235 and generate light.

As will be appreciated, various additional processes may be applied to etch semiconductor wafer 210 and various layers into a desired shape or profile, add one or more photonic elements, and/or process the quantum dot layer 235, which are discussed in greater detail elsewhere in the disclosure. Similarly, various wafer processes may be performed to the semiconductor wafer 210 prior to, or after, bonding and/or growing the various layers. For example, one or more through-silicon vias (TSV) and/or mechanical alignment features may be added to the semiconductor wafer 210, the semiconductor wafer 210 may be diced into individual components, etc., which are discussed in greater detail elsewhere in the disclosure.

Figure 3:
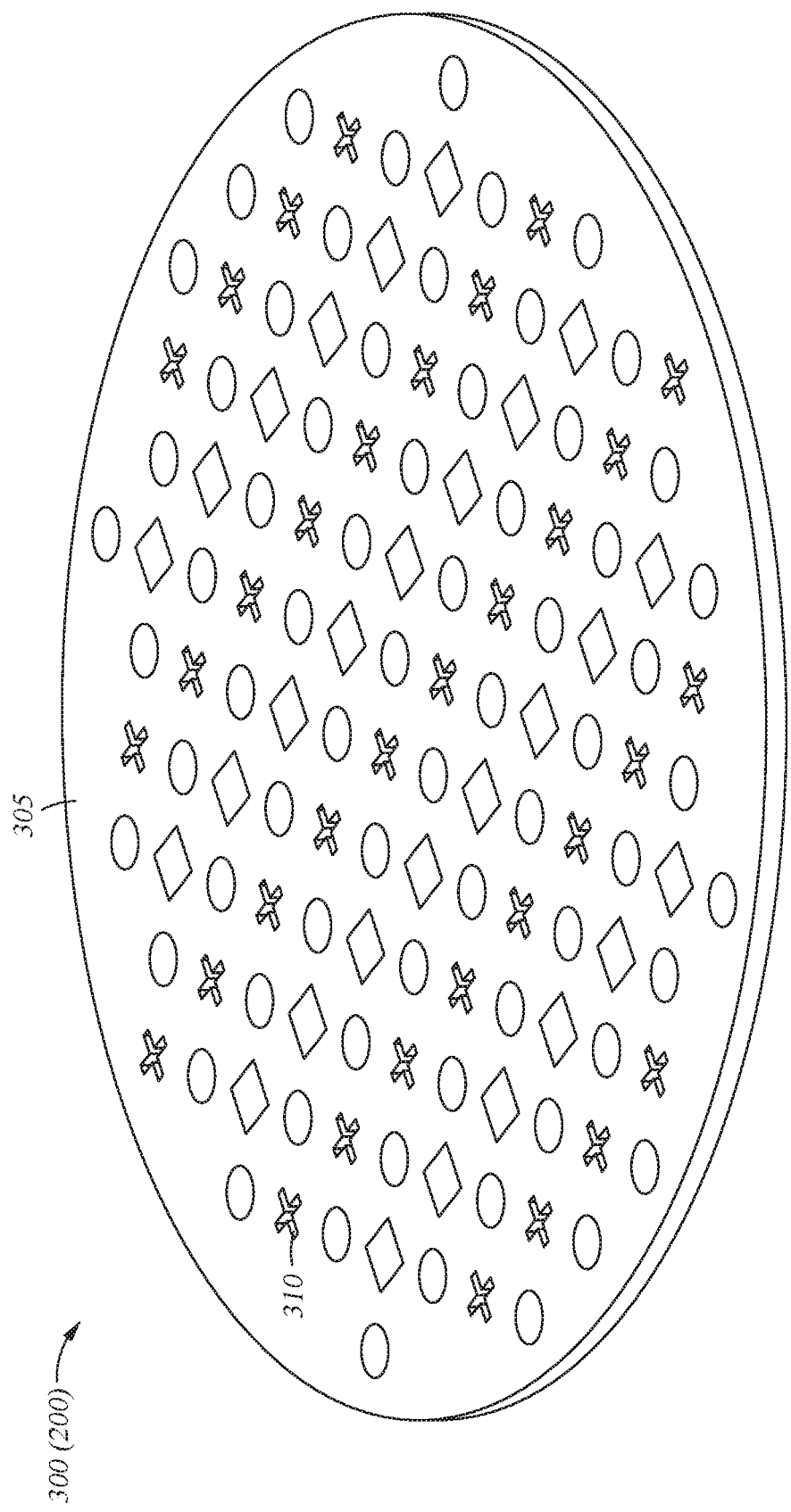
FIG. 3 is a wafer-level view of an exemplary assembly including a plurality of alignment features, according to one or more embodiments.

FIG. 3 is a wafer-level view 300 of an exemplary assembly 200 including a plurality of alignment features 310, according to one or more embodiments. More specifically, the wafer-level view 300 depicts an exterior surface 305 of the assembly 200, e.g., a surface of the semiconductor wafer 210 opposite the base layer 215. As shown, the plurality of alignment features 310 is formed at the exterior surface 305. The plurality of alignment features 310 may be used for aligning the assembly 200 during wafer-scale processing, as well as for aligning the individual components that are subsequently formed (e.g., diced) from the assembly 200.

The plurality of alignment features 310 may have any suitable form(s) in any suitable arrangement relative to the exterior surface 305. The plurality of alignment features 310 may include, but are not limited to: fiducial markers suitable for optical imaging systems (e.g., sets of two to three alignment dots in known positions), mechanical stops, metalized marks, poka-yoke features (e.g., go/no-go features for later fabrication steps), epoxy slots, and other identifying features such as crosshairs, Quick Response (QR) codes, and component callouts/labels.

The plurality of alignment features 310 may include one or more features raised from the exterior surface 305 and/or one or more features recessed (e.g., etched) into the exterior surface 305. As shown, the plurality of alignment features 310 comprises a plurality of differently-shaped features that are arranged into rows. However, other embodiments may include same-shaped features and/or different regular or irregular arrangements.

Figure 4:
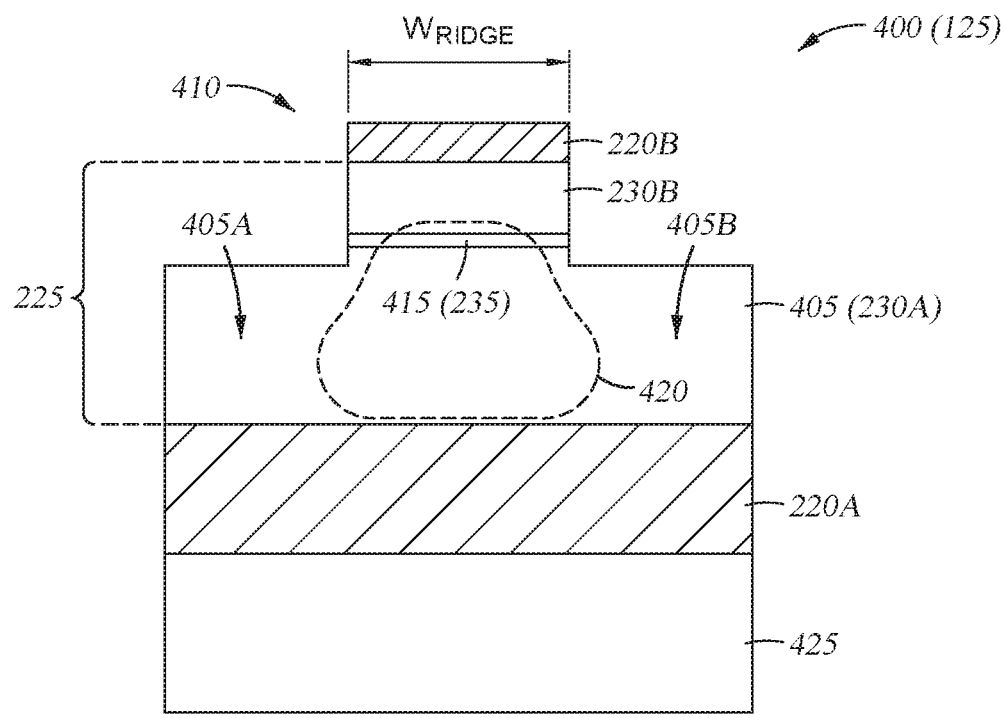
FIG. 4 is a cross-sectional view of a SCOW emitter having an optically active region disposed in a ridge, according to one or more embodiments.

FIG. 4 is a cross-sectional view of a SCOW emitter 400 having an optically active region 415 disposed in a ridge 410, according to one or more embodiments. The SCOW emitter 400 may be used in conjunction with other embodiments, such as one exemplary implementation of the SCOW emitter 125 of FIG. 1.

In the SCOW emitter 400, the ridge 410 extends from a slab 405. The slab 405 is formed in the first waveguide stratum 230A of the waveguide layer 225. The slab 405 is arranged over the first cladding layer 220A and a submount 425. In some embodiments, the submount 425 comprises the semiconductor wafer 210 of FIG. 2 (e.g., a silicon substrate).

The ridge 410 is formed partly in the first waveguide stratum 230A, partly in the quantum dot layer 235, partly in the second waveguide stratum 230B, and partly in the second cladding layer 220B. Thus, the ridge 410 forms part of a ridge waveguide which generally confines the optical signal within a portion of the waveguide layer 225 (represented as the optical mode 420). Stated another way, the majority of the power of the optical signal is confined within the region defined by the optical mode 420.

Thus, in the SCOW emitter 400, the first waveguide stratum 230A represents a first region that is doped with a first conductivity type, the second waveguide stratum 230B represents a second region that is doped with a different, second conductivity type, and the quantum dot layer 235 represents an optically active region disposed between the first region and the second region and comprising a plurality of quantum dots.

Unlike other semiconductor optical amplifiers (SOAs) that include an active region at or near the middle of the optical mode 420, in the SCOW emitter 400 the optically active region 415 (which corresponds to the quantum dot layer 235) is located near the border of the optical mode 420 (e.g., the top portion of the optical mode 420). Thus, most of the optical signal propagates in the slab 405, apart from the active region 415 and the ridge 410.

In some embodiments, the thickness of the waveguide layer 225 is between 3-5 microns and is formed from a III-V semiconductor material or alloy. In some embodiments, the width of the ridge 410 (represented as $w_{ridge}$) is between 3-5 microns. With such dimensioning, the diameter of the optical mode 420 may be 4-5 microns, which is much larger than most SOAs that support single mode amplification. As the mode size increases, the optical signal typically has multiple modes. However, the SCOW emitter 400 can have a large mode size and still support single mode amplification because of slab regions 405A, 405B of the slab 405. As an optical signal propagating in the SCOW emitter 400 generates additional modes, these modes are transmitted into, and filtered out, by the slab regions 405A and 405B. In this manner, the SCOW emitter 400 supports single mode operation at larger mode sizes supported by other SOAs. In one embodiment, the SCOW emitter 400 is a multi-mode amplifier with a mode size of the fundamental mode greater than 2.5 microns $1/e^2$ diameter, which can have significantly higher mode gain than any other higher order modes. The relationship $1/e^2$ is a typical metric for describing the size of a Gaussian beam.

As mentioned above, the relatively large size of the optical mode 420 relaxes the alignment tolerances for aligning the SCOW emitter 125 to the spot size converters in the silicon photonic chip. Further, the amplification generated by the SCOW emitter 400 can compensate for the higher losses suffered when data rates are increased. For example, the SCOW emitter 400 can be used in a transmitter that has an optical signal greater than 50 GHz and supporting data rates between 100 Gbps and 1 Tbps.

Figure 5:
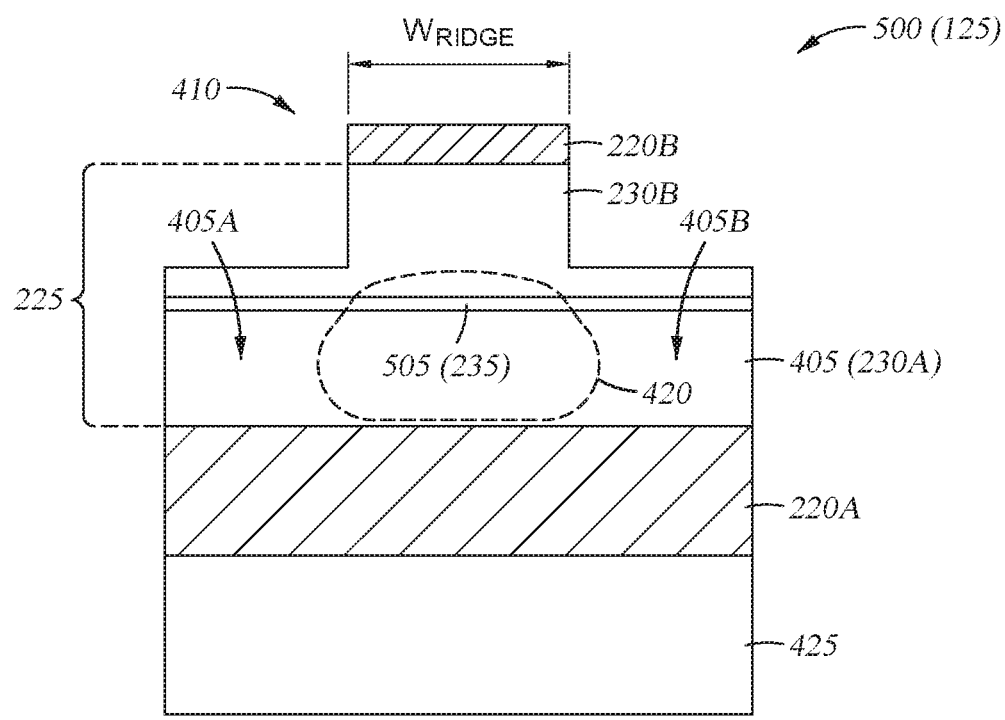
FIG. 5 is a cross-sectional view of a SCOW emitter having an optically active region disposed beneath a ridge, according to one or more embodiments.

FIG. 5 is a cross-sectional view of a SCOW emitter 500 having an optically active region 505 disposed beneath a ridge 410, according to one or more embodiments. The SCOW emitter 500 may be used in conjunction with other embodiments, such as one exemplary implementation of the SCOW emitter 125 of FIG. 1.

In the SCOW emitter 500, the optically active region 505 extends across a width of the slab 405. In other embodiments, however, the optically active region 505 extends partly along the width of the slab 405. Although the shape of the optical mode 420 is different than that depicted in FIG. 4 due to the position of the optically active region 505, most of the optical signal will propagate in the slab 405, apart from the active region 505 and the ridge 410.

The SCOW emitters 400, 500 of FIGS. 4, 5 offer several performance improvements. The large size of the optical mode 420 allows for good coupling efficiency and alignment tolerances, which supports the use of passive optical alignment techniques and bonding. Additionally, the SCOW emitters 400, 500 are capable of producing high optical power levels, such as 100 milliwatts to 1 watt or greater, which are substantially greater (e.g., approximately an order of magnitude or more) than the optical power levels provided by conventional diode lasers. The higher optical power levels supported scaling to higher data rates without requiring additional lasers.

Additionally, using the quantum dot layer 235 for the optically active regions 415, 505 offers several benefits. For example, the quantum dot layer 235 supports integration with silicon or other semiconductor materials, which enables wafer-scale processing, testing, and burn-in, which eliminates the added costs and reduced yield associated with submount attachment, and which enables additional features for the SCOW emitters 400, 500 such as through-silicon vias (TSVs), mechanical stops, fiducial markers, and so forth. Other benefits of using the quantum dot layer 235 include a reduction or elimination of additional optical components such as lenses and isolators, and operation of the SCOW emitters 400, 500 at higher temperatures.

Figure 6:
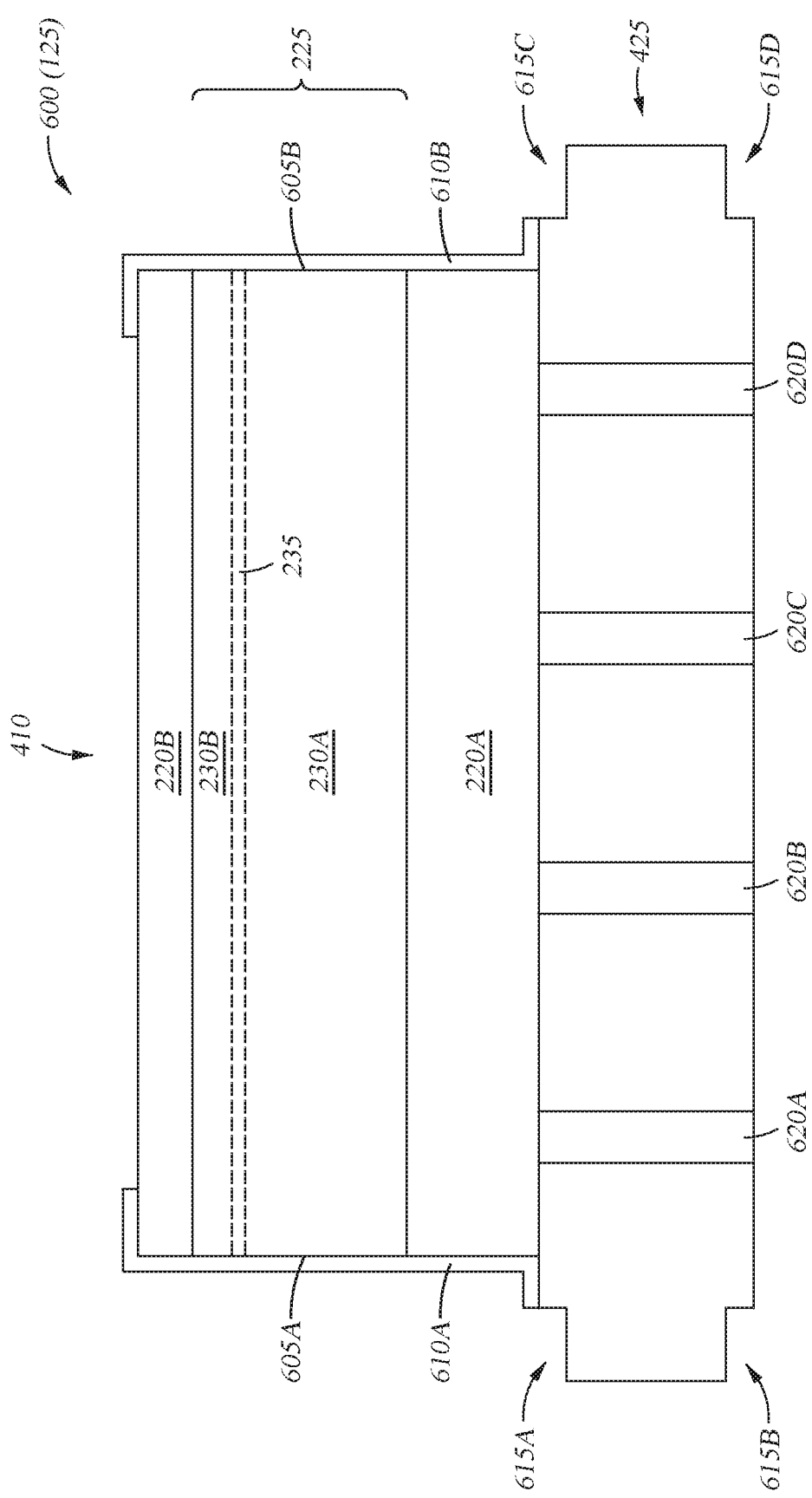
FIG. 6 is a side view of a SCOW emitter having etched facets and coatings, according to one or more embodiments.

FIG. 6 is a side view of a SCOW emitter 600 having etched facets and coatings, according to one or more embodiments. The SCOW emitter 600 may be used in conjunction with other embodiments, such as one exemplary implementation of the SCOW emitter 125 of FIG. 1.

The SCOW emitter 600 defines a first etched facet 605A and a second etched facet 605B arranged opposite the first etched facet 605A. The optical waveguide (illustrated as the waveguide layer 225) extends between the first etched facet 605A and the second etched facet 605B. By providing the first etched facet 605A and the second etched facet 605B, the dimensioning of the SCOW emitter 600 may be precisely controlled (e.g., with lithographic precision) to fit in an etched pocket of a silicon photonic chip. Further, additional steps such as cleaving (or dicing) and polishing are not needed to define the laser cavity of the SCOW emitter 600. Further, the laser cavity may be defined at wafer-scale, which enables wafer-scale testing and burn-in processes.

In the SCOW emitter 600, a first coating 610A is applied to the first etched facet 605A and a second coating 610B is applied to the second etched facet 605B. In some embodiments, the first coating 610A and the second coating 610B are applied at wafer-scale, such as dielectric deposition performed after etching the first etched facet 605A and the second etched facet 605B.

In the SCOW emitter 600, the submount 425 (which, as mentioned above, may comprise a semiconductor wafer such as a silicon substrate) includes mechanical features 615A, 615B, 615C, 615D having a predefined disposition relative to the SCOW emitter 600. In some embodiments, when one or more of the mechanical features 615A, 615B, 615C, 615D are contacted with corresponding portions of a silicon photonic chip, the optical waveguide is optically coupled with one or more optical components of the photonic chip.

The submount 425 further includes conductive vias 620A, 620B, 620C, 620D extending therethrough. In some embodiments, the conductive vias 620A, 620B, 620C, 620D comprise TSVs, although other types of vias are also contemplated. As shown, the conductive vias 620A, 620B, 620C, 620D are electrically coupled with the first waveguide stratum 230A (e.g., a first region of the optical waveguide) through the first cladding layer 220A. Additionally, the conductive vias 620A, 620B, 620C, 620D may provide an improved thermal conductivity with the SCOW emitter 600.

Figure 7:
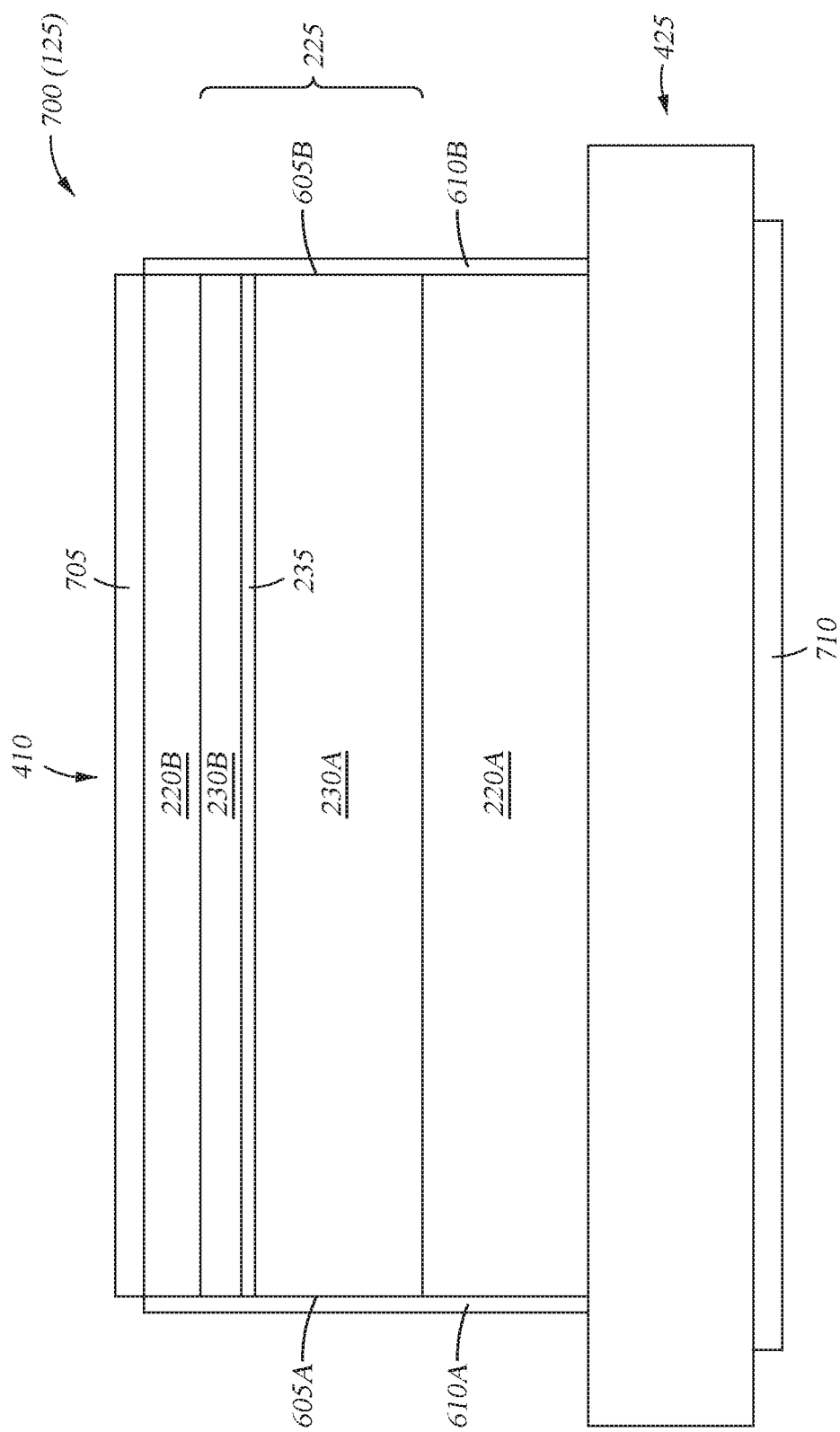
FIG. 7 is a side view of a SCOW emitter having conductive contacts, according to one or more embodiments.

FIG. 7 is a side view of a SCOW emitter 700 having conductive contacts, according to one or more embodiments. The SCOW emitter 700 may be used in conjunction with other embodiments, such as one exemplary implementation of the SCOW emitter 125 of FIG. 1.

The SCOW emitter 700 is disposed on the submount 425. A first conductive contact 705 is disposed on an exterior surface of the SCOW emitter 700, and is electrically coupled with the second waveguide stratum 230B (e.g., a second region of the optical waveguide) through the second cladding layer 220B. A second conductive contact 710 is disposed on an exterior surface of the submount 425. Although not explicitly shown, one or more conductive vias (e.g., the conductive vias 620A, 620B, 620C, 620D of FIG. 6) may electrically couple the second conductive contact 710 with the first waveguide stratum 230A through the first cladding layer 220A.

The SCOW emitter 700 (and more generally, the SCOW emitter 125) may be implemented in any suitable form. In some embodiments, the SCOW emitter 700 is implemented as a Fabry-Perot laser or a Fabry-Perot amplifier. In such a case, the first coating 610A, the second coating 610B, and the angles of the first etched facet 605A and the second etched facet 605B determine whether the laser cavity is formed by the SCOW emitter 700. In this way, the SCOW emitter 700 need not include any wavelength-selective features.

In some embodiments, the SCOW emitter 700 is implemented as a distributed Bragg reflector (DBR) or a distributed feedback (DFB) laser. In such a case, wavelength-selective gratings are formed directly into III-V semiconductor material (e.g., written into the first waveguide stratum 230A and/or the second waveguide stratum 230B).

In some embodiments, the SCOW emitter 700 is implemented as an external cavity laser, in which a III-V amplifier or a reflective amplifier is used as the gain medium. In such a case, one or more wavelength-selective elements (e.g., gratings, rings, etc.) are implemented external to the SCOW emitter 700 (e.g., within a silicon photonic chip).

Figure 8:
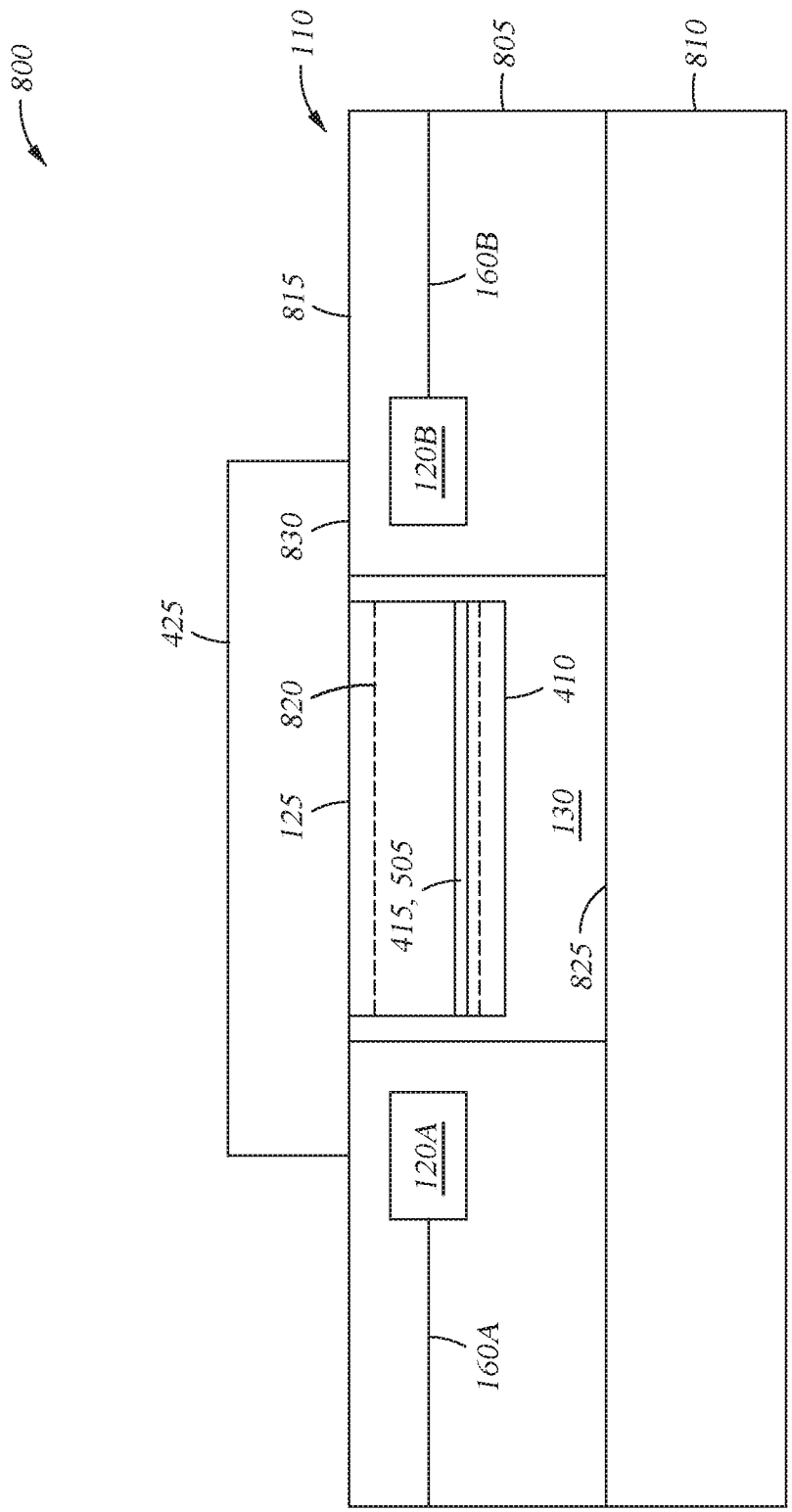
FIG. 8 is a side view of a SCOW emitter mounted on a silicon photonic chip, according to one or more embodiments.

FIG. 8 is a side view 800 of a SCOW emitter 125 mounted on a silicon photonic chip 110, according to one or more embodiments. The features depicted in the side view 800 may be used in conjunction with other embodiments.

The silicon photonic chip 110 includes an insulator layer 805 (e.g., an interlayer dielectric (ILD) disposed on a silicon substrate 810 (e.g., a monocrystalline silicon substrate). During fabrication, the insulator layer 805 is processed to form the spot size converters 120A, 120B which transfer an optical signal into, and receive an amplified optical signal from, the SCOW emitter 125 as well as the waveguides 160A, 160B (e.g., silicon nitride or silicon oxynitride waveguides).

As shown, the SCOW emitter 125 is arranged within the etched pocket 130 formed in the insulator layer 805, such that respective ends of a waveguide 820 in the SCOW emitter 125 (shown generally by the dashed lines) is aligned with the spot size converters 120A, 120B. As shown, the etched pocket 130 extends fully through the insulator layer 805 to a surface 825 of the silicon substrate 810. The SCOW emitter 125 includes a ridge 410 and an active region 415, 505 (e.g., formed in a quantum dot layer) which confine the optical signal within the waveguide 820 and provide optical amplification. The functions of these components are discussed in greater detail above.

As shown, the submount 425 is disposed above the insulator layer 805. When aligning the SCOW emitter 125 to the spot size converters 120A, 120B, an external surface 830 of the submount 425 is brought into contact with an external surface 815 (e.g., a top surface of the insulator layer 805) of the silicon photonic chip 110. Although not shown, an adhesive may be used to fasten the submount 425 to the external surface 815 to thereby maintain the alignment between the waveguide 820 and the spot size converters 120A, 120B.

In one embodiment, the SCOW emitter 125 includes at least two conductive contacts for providing power to perform optical amplification on the optical signal propagating through the waveguide 820. In one example, the two conductive contacts are disposed on a top surface of the submount 425 (e.g., outside the etched pocket 130) and are wire bonded or otherwise electrically coupled with a power source on the silicon photonic chip 110 or another chip. In another example, at least one conductive contact is disposed on the top surface of the submount 425 while another electrode is disposed on a bottom surface of the ridge 410 (e.g., the side of the ridge 410 facing with the surface 825). In this case, the silicon photonic chip 110 may include an electrode on the surface 825, which is then soldered or otherwise electrically coupled with the conductive contact disposed on the bottom surface of the ridge 410 for providing power to the SCOW emitter 125.

Figure 9:
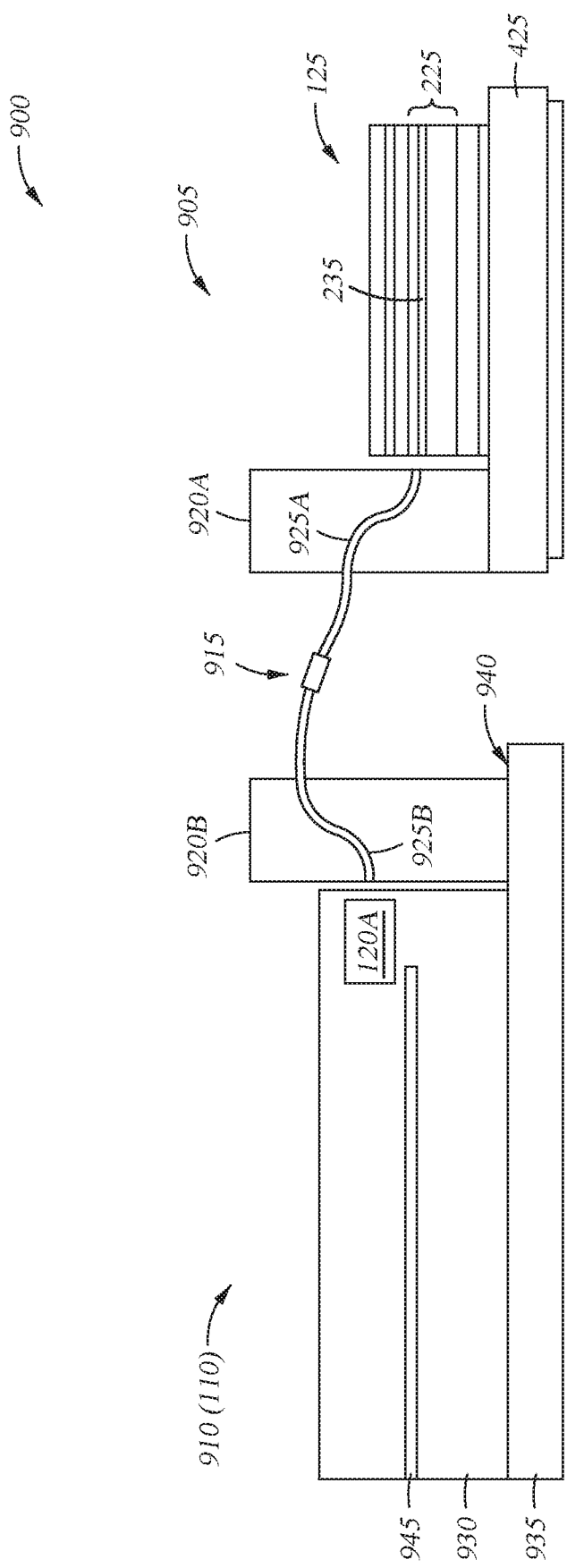
FIG. 9 is a side view of a remote connection of a SCOW emitter with a silicon photonic chip, according to one or more embodiments.

FIG. 9 is a side view 900 of a remote connection of a SCOW emitter 125 with a silicon photonic chip 110, according to one or more embodiments. The features depicted in the side view 900 may be used in conjunction with other embodiments.

A laser package 905 comprising the SCOW emitter 125 is optically coupled with a photonic module 910 comprising the silicon photonic chip 110. An output interface 920A is formed on the submount 425 and provides an optical interface between the optical waveguide formed by the SCOW emitter 125 and an optical fiber 915. In some embodiments, the output interface 920A is formed in a dielectric material and includes one or more waveguides 925A (e.g., silicon nitride or silicon oxynitride).

An input interface 920B is formed on a surface 940 of a substrate 935 (e.g., a silicon substrate). An ILD 930 (e.g., a silicon oxide) is formed on the surface 940, and a waveguide 945 and the spot size converter 120A are formed in the ILD 930. The input interface 920B provides an optical interface between the optical fiber 915 and the spot size converter 120A. In some embodiments, the input interface 920B is formed in a dielectric material (e.g., a same material as the ILD 930) and includes one or more waveguides 925B (e.g., silicon nitride or silicon oxynitride).

In another embodiment, the high optical output power of the SCOW emitter 125 enables using the laser package 905 as a remote laser source for a plurality of optical channels and/or a plurality of photonic modules 910. In some cases, one or more optical splitters are implemented in silicon photonics, such as within the output interface 920A. In other cases, the one or more optical splitters are implemented in the optical fiber 915 connection between the output interface 920A and the input interface 920B.

Figure 10:
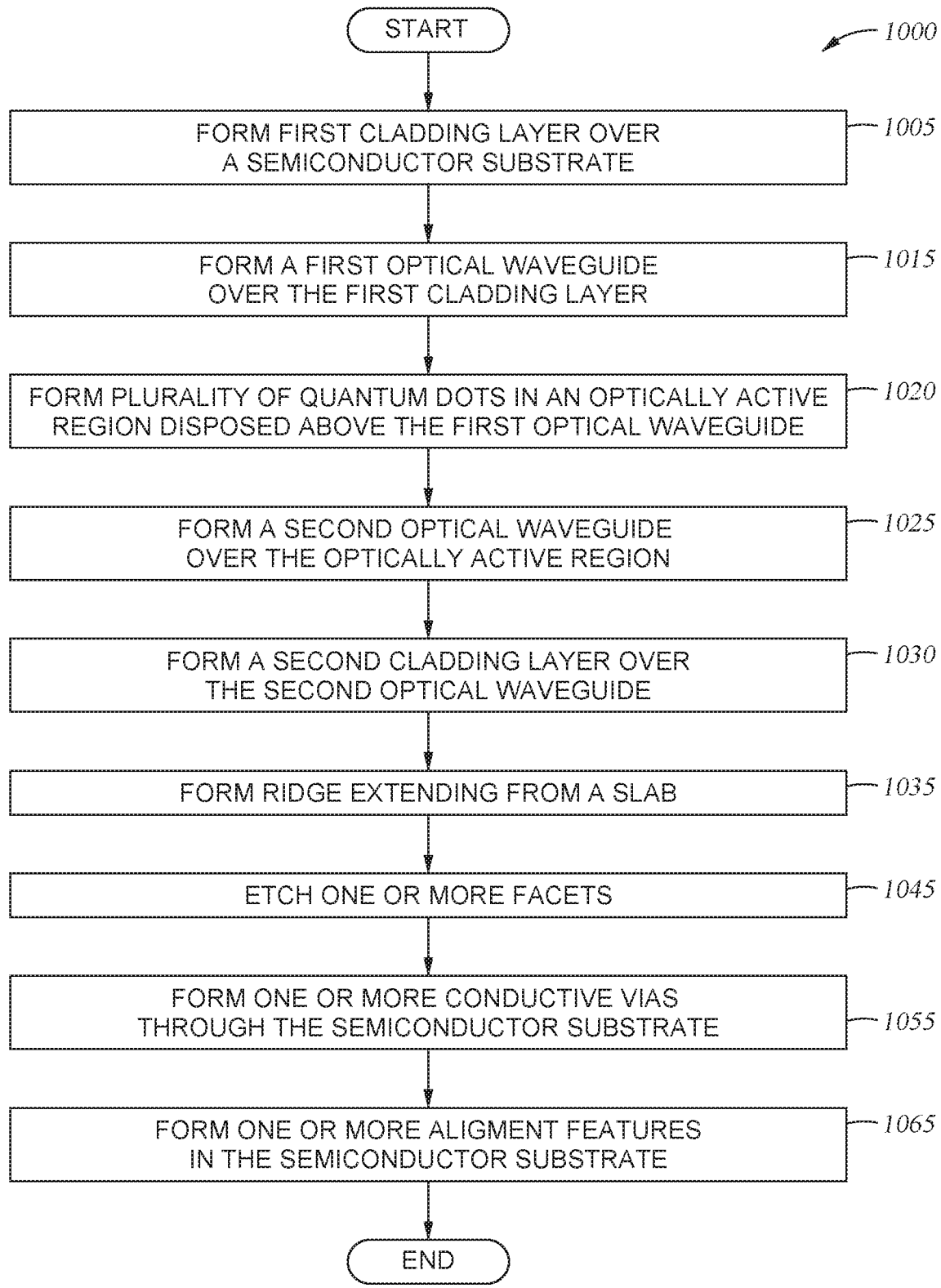
FIG. 10 is a method of fabricating a SCOW emitter, according to one or more embodiments.

FIG. 10 is a method 1000 of fabricating a SCOW emitter, according to one or more embodiments. The method 1000 may be used in conjunction with other embodiments, such as fabricating the SCOW emitter 125.

The method 1000 begins at block 1005, where a first cladding layer is formed over a semiconductor substrate. At block 1015, a first optical waveguide is formed over the first cladding layer. At block 1020, a plurality of quantum dots are formed in an optically active region disposed above the first optical waveguide. At block 1025, a second optical waveguide is formed over the optically active region. At block 1030, a second cladding layer is formed over the second optical waveguide.

At block 1035, a ridge is formed that extends from a slab. At block 1045, one or more facets are etched into the SCOW emitter. In some embodiments, a first coating is applied to a first facet, and a second coating is applied to a second facet. At block 1055, one or more conductive vias are formed through the semiconductor substrate. In some embodiments, the one or more conductive vias are coupled with one of the first region and the second region. At block 1065, one or more alignment features are formed in the semiconductor substrate. In some embodiments, the one or more alignment features comprise one or more mechanical features configured to contact corresponding portions of a photonic chip. The method 1000 ends following completion of block 1065.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure.

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical apparatus comprising:
a semiconductor substrate defining alignment features for coupling with a photonic chip; and
a slab-coupled optical waveguide (SCOW) emitter disposed on the semiconductor substrate, the SCOW emitter comprising:
an optical waveguide comprising:
a first region doped with a first conductivity type;
a second region doped with a different, second conductivity type; and
an optically active region disposed between the first region and the second region, the optically active region comprising a plurality of quantum dots.

2. The optical apparatus of claim 1, wherein the semiconductor substrate comprises a silicon substrate.

3. The optical apparatus of claim 1, wherein the optical waveguide comprises a ridge extending from a slab, and
wherein the first region is disposed entirely in the ridge.

4. The optical apparatus of claim 3, wherein the optically active region is disposed in the ridge.

5. The optical apparatus of claim 3, wherein the optically active region is disposed in the slab.

6. The optical apparatus of claim 1, wherein the semiconductor substrate comprises one or more conductive vias extending through the semiconductor substrate, and
wherein the one or more conductive vias are coupled with one of the first region and the second region.

7. The optical apparatus of claim 1, wherein the alignment features comprise one or more mechanical features having a predefined disposition relative to the SCOW emitter, and
wherein, when the one or more mechanical features are contacted with corresponding portions of the photonic chip, the optical waveguide is optically coupled with one or more optical components of the photonic chip.

8. The optical apparatus of claim 1, wherein the SCOW emitter further comprises:
a first etched facet having a first coating applied thereto; and
a second etched facet having a second coating applied thereto,
wherein the optical waveguide extends between the first etched facet and the second etched facet.

9. A method of fabricating a slab-coupled optical waveguide (SCOW) emitter, the method comprising:
forming a first cladding layer over a semiconductor substrate;
forming alignment features in the semiconductor substrate;
forming a first optical waveguide over the first cladding layer, wherein the first optical waveguide is doped with a first conductivity type;
forming a plurality of quantum dots in an optically active region disposed above the first optical waveguide;
forming a second optical waveguide over the optically active region, wherein the second optical waveguide is doped with a different, second conductivity type; and
forming a second cladding layer over the second optical waveguide.

10. The method of claim 9, further comprising:
forming a ridge extending from a slab,
wherein the second optical waveguide is disposed entirely in the ridge.

11. The method of claim 10, wherein forming the ridge comprises:
etching a plurality of portions of the second optical waveguide.

12. The method of claim 9, further comprising:
forming one or more conductive vias through the semiconductor substrate,
wherein the one or more conductive vias are coupled with the first optical waveguide.

13. The method of claim 9, further comprising:
etching a first facet and a second facet in the SCOW emitter,
wherein the first optical waveguide and the second optical waveguide extend between the first facet and the second facet.

14. The method of claim 13, further comprising:
applying a first coating to the first facet; and
applying a second coating to the second facet.

15. An optical system comprising:
a photonic chip comprising:
- an optical component having a first height relative to a first surface;
- a semiconductor substrate having a second surface and defining mechanical features relative to the second surface; and
- a slab-coupled optical waveguide (SCOW) emitter contacting the second surface, the SCOW emitter comprising:
  - an optical waveguide having a second height relative to the second surface, wherein the optical waveguide is optically coupled with the optical component when the mechanical features are contacted with corresponding portions of the photonic chip, the optical waveguide comprising:
    - a first region doped with a first conductivity type;
    - a second region doped with a different, second conductivity type; and
    - an optically active region disposed between the first region and the second region, the optically active region comprising a plurality of quantum dots,
  - wherein, when the first surface makes contact with the second surface, the optical waveguide is optically aligned with the optical component in at least one dimension.

16. The optical system of claim 15, wherein the first surface is defined by an insulator layer of the photonic chip, and wherein the optical component is formed in the insulator layer.

17. The optical system of claim 16, wherein a cavity is formed in the insulator layer from the first surface, wherein the second surface makes contact with the first surface on opposing sides of the cavity, and wherein the SCOW emitter is disposed in the cavity.

* * * * *